US012683130B2

(12) United States Patent
Choi et al.

(10) Patent No.: US 12,683,130 B2
(45) Date of Patent: Jul. 14, 2026

(54) PLASMA REACTION APPARATUS

(71) Applicant: NEW POWER PLASMA CO., LTD.,
Suwon-si (KR)

(72) Inventors: Dai Kyu Choi, Seoul (KR); Eun Seok Lim, Suwon-si (KR)

(73) Assignee: NEW POWER PLASMA CO., LTD.,
Suwon-si (KR)

( * ) Notice: Subject to any disclaimer, the term of this patent is extended or adjusted under 35 U.S.C. 154(b) by 852 days.

(21) Appl. No.: 18/010,520

(22) PCT Filed: Jul. 29, 2020

(86) PCT No.: PCT/KR2020/010000
§ 371 (c)(1),
(2) Date: Dec. 15, 2022

(87) PCT Pub. No.: WO2021/256604
PCT Pub. Date: Dec. 23, 2021

(65) Prior Publication Data
US 2023/0245866 A1 Aug. 3, 2023

(30) Foreign Application Priority Data

Jun. 16, 2020 (KR) ........................ 10-2020-0073077

(51) Int. Cl.
*H01J 37/32* (2006.01)

(52) U.S. Cl.
CPC .. *H01J 37/32669* (2013.01); *H01J 37/32357* (2013.01); *H01J 37/32449* (2013.01); *H01J 37/32522* (2013.01)

(58) Field of Classification Search
CPC .......... H01J 37/32669; H01J 37/32357; H01J 37/32449; H01J 37/32522; H01J 37/32;
(Continued)

(56) References Cited

U.S. PATENT DOCUMENTS 6,475,336 B1 * 11/2002 Hubacek ............. C23C 16/4586
156/345.47
8,597,464 B2 * 12/2013 Choi ................. H01J 37/32357
118/723 AN
(Continued)

FOREIGN PATENT DOCUMENTS

KR 10-2016-0049635 A 5/2016
KR 10-2016-0129304 A 11/2016
(Continued)

*Primary Examiner* — Abdullah A Riyami
*Assistant Examiner* — Syed M Kaiser
(74) *Attorney, Agent, or Firm* — Bridgeway IP Law Group, PLLC; Sang Ho Lee; Hyun Woo Shin

(57) ABSTRACT

Provided is a plasma reaction apparatus capable of preventing edge cracks of a magnetic core by dividing the core, the plasma reaction apparatus including a reactor body having a gas inlet at a side thereof, a plasma outlet at another side thereof, and an annular loop space therein, and a magnetic core provided in a shape surrounding at least a part of the reactor body, and having a primary coil to generate plasma by exciting a gas in the annular loop space, wherein the magnetic core includes a middle core layer, an upper core layer mounted on the middle core layer, and a lower core layer mounted under the middle core layer, wherein the upper core layer is divided into a first core layer and a second core layer to prevent edge cracks of the upper core layer by reducing an upper thermal deviation, and wherein the lower core layer is divided into a third core layer and a fourth core layer to prevent edge cracks of the lower core layer by reducing a lower thermal deviation.

18 Claims, 7 Drawing Sheets

(58) Field of Classification Search
CPC .. H01J 37/321; H01J 37/3211; H01J 37/3244; H01J 37/32834
See application file for complete search history.

(56) References Cited

U.S. PATENT DOCUMENTS

| | | | | | |
|---|---|---|---|---|---|
| 8,845,855 | B2 * | 9/2014 | Hubacek | ............. | H01J 37/3255 |
| | | | | | 156/345.43 |
| 2006/0289409 | A1 * | 12/2006 | Choi | ................. | H01J 37/32009 |
| | | | | | 219/121.57 |
| 2016/0163513 | A1 | 6/2016 | Lubomirsky | | |
| 2023/0245866 | A1 * | 8/2023 | Choi | ................. | H01J 37/32522 |
| | | | | | 315/111.21 |

FOREIGN PATENT DOCUMENTS

| | | | | | |
|---|---|---|---|---|---|
| KR | 10-2018-0010816 | A | 1/2018 | | |
| KR | 10-2018-0137205 | A | 12/2018 | | |
| KR | 10-1950024 | B1 | 2/2019 | | |
| WO | WO-2018218797 | A1 * | 12/2018 | ............ | H01J 37/321 |

* cited by examiner

PLASMA REACTION APPARATUS

TECHNICAL FIELD

The present invention relates to a plasma reaction apparatus, and more particularly, to a plasma reaction apparatus capable of preventing edge cracks of a magnetic core by dividing the core.

BACKGROUND ART

Plasma discharge is used for gas excitation to generate an active gas including ions, free radicals, atoms, and molecules. The active gas is widely used in various fields and typically in various semiconductor manufacturing processes such as etching, deposition, cleaning, and ashing.

Currently, wafers or liquid crystal display (LCD) glass substrates for manufacturing semiconductor devices are increasing in size. As such, a scalable plasma source having a high plasma ion energy controllability and a large-area processability is demanded.

It is known that a remote plasma is very useful in such semiconductor manufacturing processes using plasma.

For example, the remote plasma is useful to clean a process chamber or in an ashing process for photoresist strips. However, because process chambers are increasing in volume due to the increase in size of substrates to be processed, a plasma source capable of remotely and sufficiently supplying a high-density active gas is also demanded.

Meanwhile, remote plasma reactors (or remote plasma generators) include those using a transformer coupled plasma source and those using an inductively coupled plasma source. The remote plasma reactors using the transformer coupled plasma source have a structure in which a magnetic core with a primary coil is mounted on a toroidal reactor body. The remote plasma reactors using the inductively coupled plasma source have a structure in which an inductively coupled antenna is mounted on a hollow tubular reactor body.

For example, a gas injected into a plasma reactor makes a gaseous material into a form of plasma including ions, free radicals, atoms, and molecules due to electrical force, and the plasma is used for various purposes such as etching, deposition, and cleaning at a remote place.

As disclosed in Korean Patent Publication No. 10-2016-0129304, an existing plasma reaction apparatus may include a magnetic core having a primary coil and mounted in a shape surrounding a reactor body to generate plasma by exciting a gas in an annular loop space.

However, because the magnetic core has a severe thermal deviation at both ends, i.e., upper and lower edges, and a deviation of electrical or thermal energy is getting severe toward the upper and lower edges to cause edge cracks, electrical or thermal properties may deteriorate to reduce plasma generation efficiency or even an arc or short may occur due to damage of the magnetic core to cause breakage of the apparatus.

DETAILED DESCRIPTION OF THE INVENTION

Technical Problem

The present invention provides a plasma reaction apparatus capable of preventing edge cracks of a magnetic core by reducing a thermal deviation at edges by dividing upper and lower portions of the magnetic core, and of making block ignition more stably. However, the scope of the present invention is not limited thereto.

Technical Solution

According to an aspect of the present invention, there is provided a plasma reaction apparatus including a reactor body having a gas inlet at a side thereof, a plasma outlet at another side thereof, and an annular loop space therein, and a magnetic core provided in a shape surrounding at least a part of the reactor body, and having a primary coil to generate plasma by exciting a gas in the annular loop space, wherein the magnetic core includes a middle core layer, an upper core layer mounted on the middle core layer, and a lower core layer mounted under the middle core layer, wherein the upper core layer is divided into a first core layer and a second core layer to prevent edge cracks of the upper core layer by reducing an upper thermal deviation, and wherein the lower core layer is divided into a third core layer and a fourth core layer to prevent edge cracks of the lower core layer by reducing a lower thermal deviation.

The first core layer, the second core layer, the middle core layer, the third core layer, and the fourth core layer may have substantially the same shape, and may be stacked on one another in a vertical direction and assembled to form a total of five layers.

The magnetic core may include a left core provided in a rectangular ring shape surrounding a first I block which forms a side of the annular loop space, and a right core provided in a rectangular ring shape surrounding a second I block which forms another side of the annular loop space, and each of the first core layer, the second core layer, the middle core layer, the third core layer, and the fourth core layer of the left core or the right core may include a front block having a U shape, and a rear block having an inverse U shape.

The plasma reaction apparatus may further include a first cooling plate mounted between the first core layer and the second core layer, a second cooling plate mounted between the second core layer and the middle core layer, a third cooling plate mounted between the middle core layer and the third core layer, and a fourth cooling plate mounted between the third core layer and the fourth core layer.

The plasma reaction apparatus may further include first bent portions bent downward from the first cooling plate along side surfaces of the second core layer, and second bent portions bent upward from the second cooling plate along side surfaces of the second core layer, and having engaging portions to engage with the first bent portions.

The plasma reaction apparatus may further include a first thermal pad mounted between the first core layer and the first cooling plate, and a second thermal pad mounted between the first cooling plate and the second core layer.

The reactor body may include an upper block having the gas inlet, a lower block having the plasma outlet, and an I block connecting the upper block with the lower block, and including a first I block and a second I block to form the annular loop space, and, to increase an ignition area of facing surfaces between the upper block and the I block or between the I block and the lower block for block ignition, round surfaces, cross-sections of which are convex, are provided at edges of the facing surfaces.

Advantageous Effects

In the above-described plasma reaction apparatus according to an embodiment of the present invention, edge cracks of a magnetic core may be prevented by reducing a thermal deviation at edges by dividing upper and lower portions of the magnetic core, and block ignition may be made more stably. However, the scope of the present invention is not limited to the above-described effects.

BEST MODE

Figure 1:
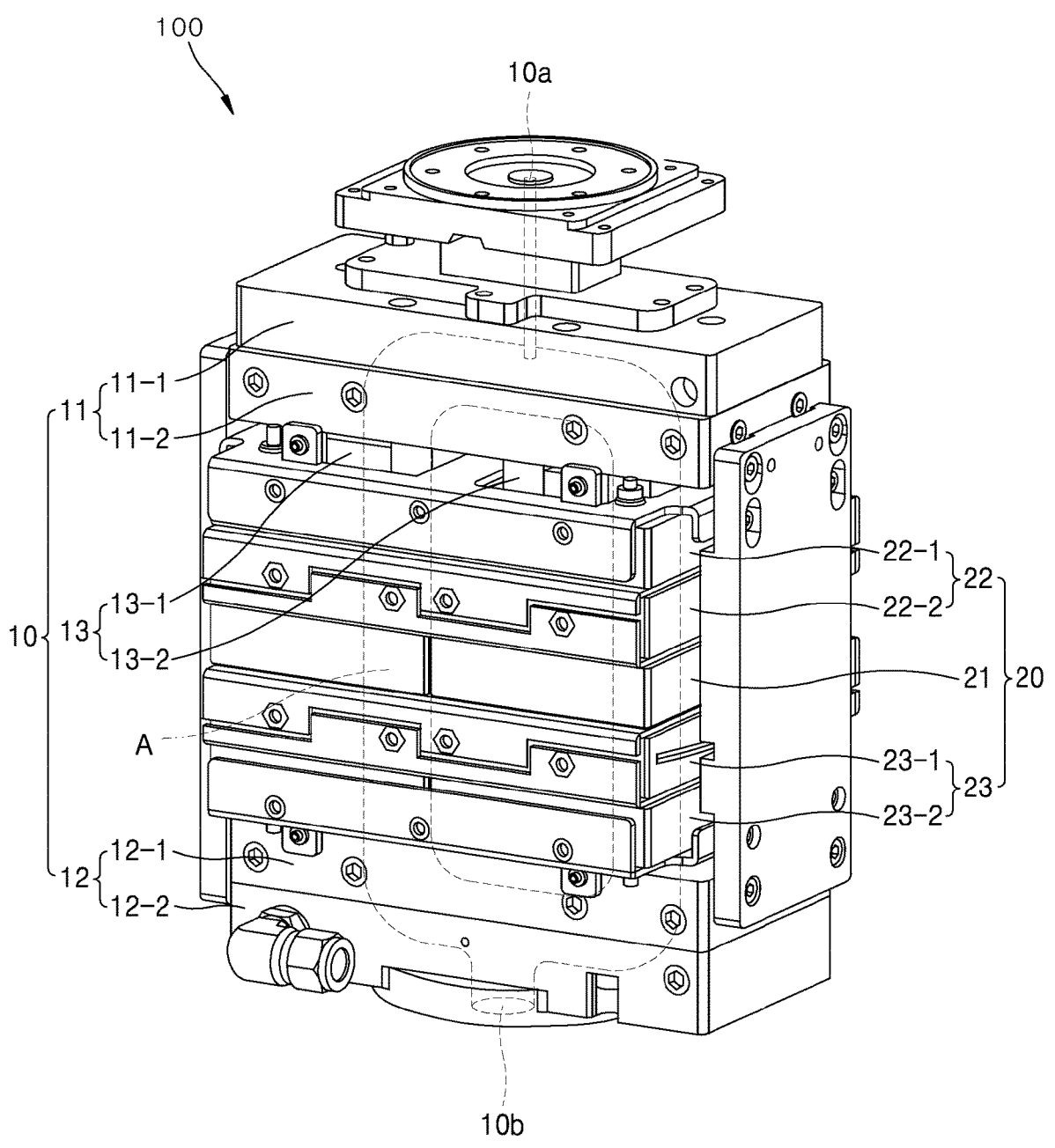
FIG. 1 is an external perspective view of a plasma reaction apparatus according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

FIG. 1 is an external perspective view of a plasma reaction apparatus 100 according to some embodiments of the present invention.

Initially, as illustrated in FIG. 1, the plasma reaction apparatus 100 according to some embodiments of the present invention may mainly include a reactor body 10 and a magnetic core 20.

For example, as illustrated in FIG. 1, the reactor body 10 may use a remote plasma generator (RPG) of a toroidal shape, i.e., a transformer-coupled type, and have a gas inlet 10*a* at a side thereof, a plasma outlet 10*b* at another side thereof, and an annular loop space A therein.

Specifically, for example, as illustrated in FIG. 1, the reactor body 10 may mainly include 3 types of blocks, e.g., an upper block 11 having the gas inlet 10*a*, a lower block 12 having the plasma outlet 10*b*, and an I block 13 connecting the upper block 11 with the lower block 12, and including a first I block 13-1 and a second I block 13-2 to form the annular loop space A.

Herein, for example, as illustrated in FIG. 1, to form an upper horizontal portion of the annular loop space where a gas is split into two streams, and to be easily produced using blocks, inner portions of which are cut out, the upper block 11 may include a first upper block 11-1 having an upper expanded inner surface including the gas inlet 10*a*, and a second upper block 11-2 assembled with the first upper block 11-1 and having an inner surface for splitting the expanded inner surface into two channels.

Specifically, for example, the first and second upper blocks 11-1 and 11-2 may be metal blocks made of a conductive material such as aluminum, aluminum alloy, steel, or stainless steel having conductive properties.

The first and second upper blocks 11-1 and 11-2 are illustrated as cuboid blocks in FIG. 1, but are not limited thereto and may be block structures of a wide variety of shapes, e.g., polygonal structures or curved structures.

Figure 2:
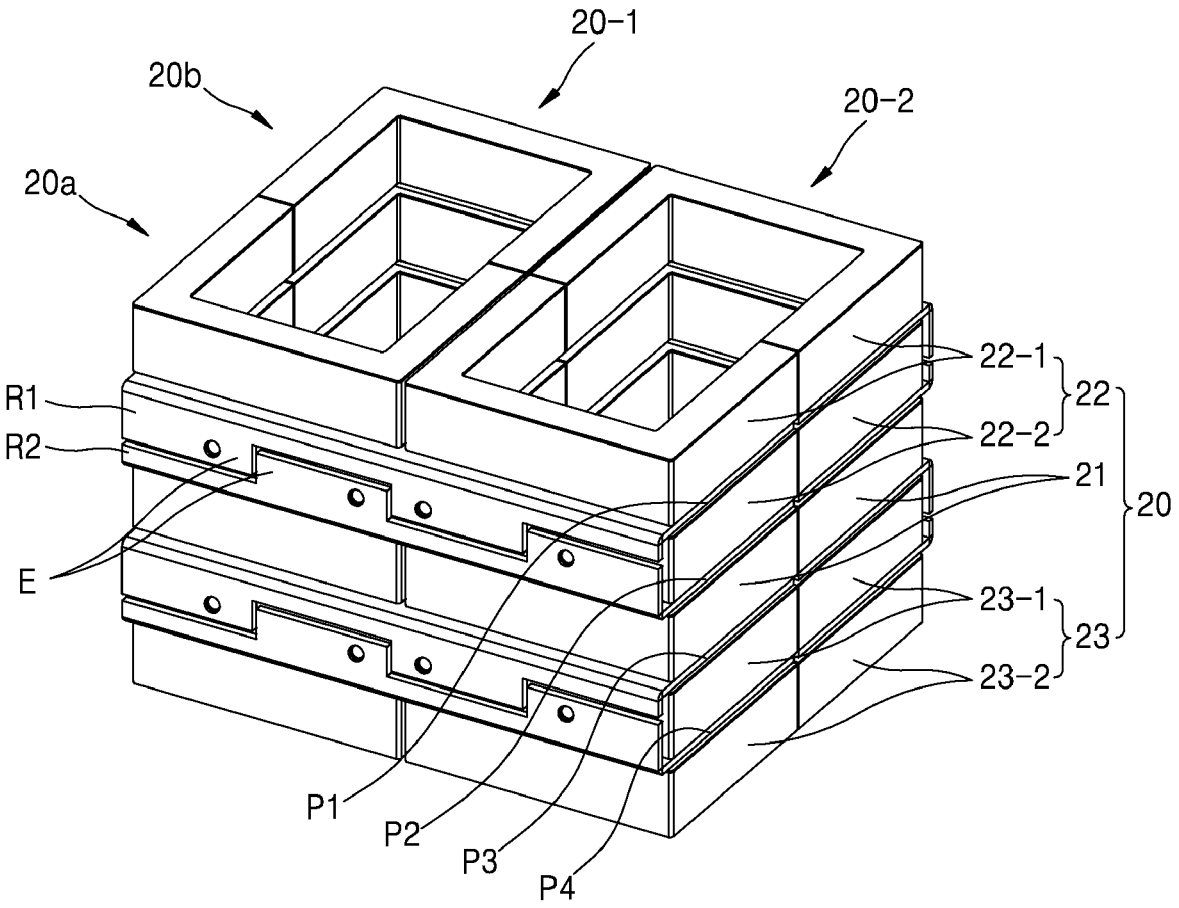
FIG. 2 is a perspective view of a magnetic core of the plasma reaction apparatus of FIG. 1.

Meanwhile, for example, as illustrated in FIGS. 1 and 2, the lower block 12 may be a block structure connected to the I block 13 to combine the two streams to form the annular loop space A and discharge plasma generated in the annular loop through the plasma outlet 10*b*.

Specifically, for example, to combine the two spilt streams of the gas into one, and to be easily produced using blocks, inner portions of which are cut out, the lower block 12 may include a first lower block 12-1 having a narrowed inner surface to combine the spilt streams of the gas into one, and a second lower block 12-2 assembled with the first lower block 12-1 to combine the narrowed inner surface with the plasma outlet 10*b*.

Specifically, for example, the first and second lower blocks 12-1 and 12-2 may be metal blocks made of a conductive material such as aluminum, aluminum alloy, steel, or stainless steel having conductive properties.

The first and second lower blocks 12-1 and 12-2 are illustrated as cuboid blocks in FIG. 1, but are not limited thereto and may be block structures of a wide variety of shapes, e.g., polygonal structures or curved structures.

For example, as illustrated in FIG. 1, the lower block 12 is a block structure connected to a lower surface of the I block 13, and may be a cuboid block to form a lower horizontal portion of the annular plasma loop space.

However, the lower block 12 is not limited to the illustration, and may be a block structure of a wide variety of shapes, e.g., a circular pipe or a polygonal pipe.

Specifically, for example, the lower block 12 may be a metal block made of a conductive material such as aluminum, aluminum alloy, steel, or stainless steel having conductive properties.

Herein, the above-described I block 13 and lower block 12 need to be insulated from each other for a block ignition function or to cut off a leakage current or increase power efficiency, and may be spaced apart from each other by a certain distance.

For example, as illustrated in FIG. 1, the I block 13 is a block structure connected between the upper and lower blocks 11 and 12, and may be a block including two rectangular pipes, i.e., the first and second I blocks 13-1 and 13-2, to form a vertical portion of the annular plasma loop space.

However, the I block 13 is not limited to the illustration, and may be a block including block structures of a wide variety of shapes, e.g., circular pipes or polygonal pipes.

Specifically, for example, the I block 13 may be a metal block made of a conductive material such as aluminum, aluminum alloy, steel, or stainless steel having conductive properties.

Herein, the above-described upper block 11 and I block 13 need to be insulated from each other for a block ignition function or to cut off a leakage current or increase power efficiency, and may be spaced apart from each other by a certain distance.

Therefore, although not shown in FIG. 1, the above-described upper block 11, I block 12, and lower block 13 may be detachably coupled to each other by using various clamps, brackets, bolts, screws, nuts, or the like.

Figure 3:
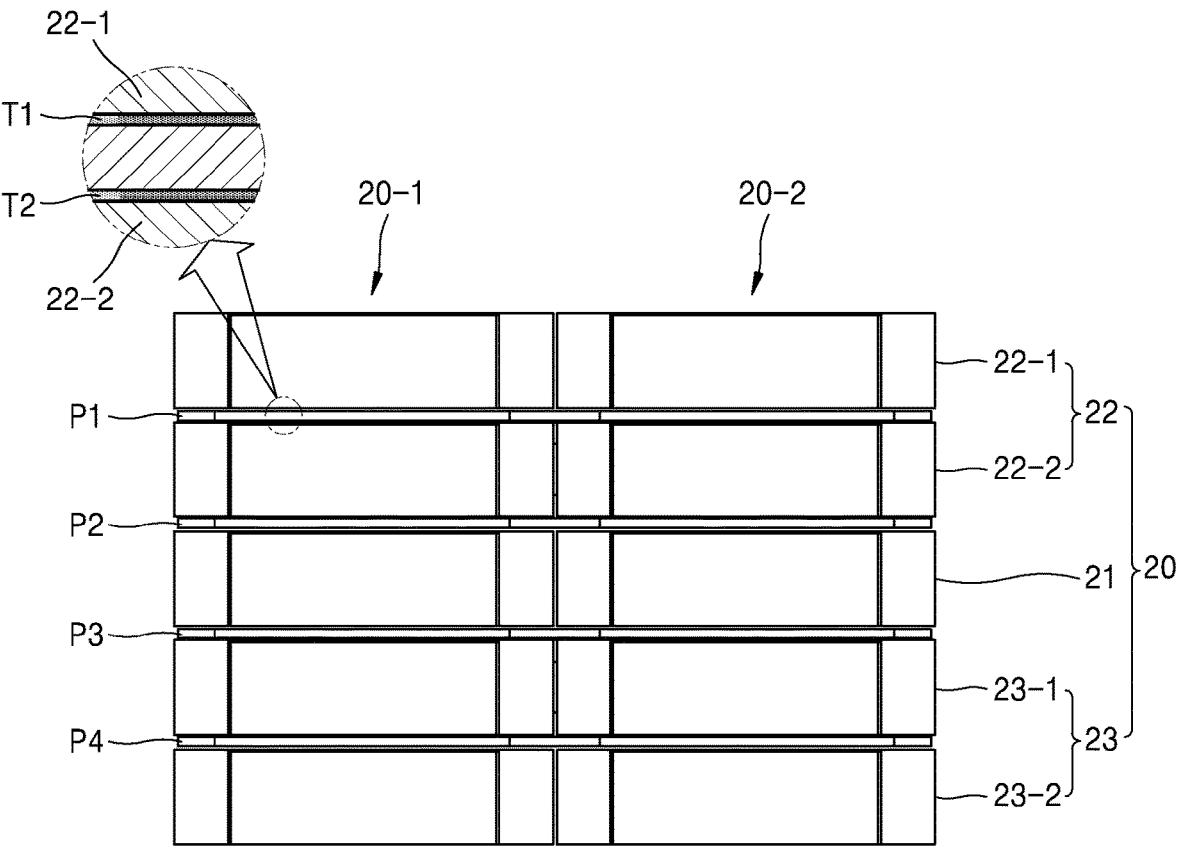
FIG. 3 is a front view of a magnetic core of the plasma reaction apparatus of FIG. 1.

FIG. 2 is a perspective view of the magnetic core 20 of the plasma reaction apparatus 100 of FIG. 1, and FIG. 3 is a front view of the magnetic core 20 of the plasma reaction apparatus 100 of FIG. 1.

As illustrated in FIGS. 1 to 3, for example, the magnetic core 20 may be a structure provided in a shape surrounding at least a part of the reactor body 10, and having a primary coil (not shown) to generate plasma by exciting a gas in the annular loop space A.

For example, as illustrated in FIGS. 1 to 3, the magnetic core 20 may include a middle core layer 21 mounted in the middle, an upper core layer 22 mounted on the middle core layer 21, and a lower core layer 23 mounted under the middle core layer 21, wherein the upper core layer 22 may be divided into a first core layer 22-1 and a second core layer 22-2 to prevent edge cracks of the upper core layer 22 by reducing an upper thermal deviation, and wherein the lower core layer 23 may be divided into a third core layer 23-1 and a fourth core layer 23-2 to prevent edge cracks of the lower core layer 23 by reducing a lower thermal deviation.

Specifically, for example, the first core layer 22-1, the second core layer 22-2, the middle core layer 21, the third core layer 23-1, and the fourth core layer 23-2 may have substantially the same shape, and be stacked on one another in a vertical direction and assembled to form a total of five layers.

According to repeated tests, when the magnetic core 20 is provided in three or four layers, edge cracks may not be easily prevented, and when the magnetic core 20 is provided in six or more layers, an excessively small thickness of core layers may cause a risk of breakage and significantly increase the difficulty of assembly, and interlayer uniformity of electrical properties may be reduced. Thus, the magnetic core 20 may be provided in five layers.

For example, as illustrated in FIG. 2, the magnetic core 20 may include a left core 20-1 provided in a rectangular ring shape surrounding the first I block 13-1 which forms a side of the annular loop space A, and a right core 20-2 provided in a rectangular ring shape surrounding the second I block 13-2 which forms another side of the annular loop space, to respectively correspond to the two I blocks 13.

For example, as illustrated in FIG. 2, considering assemblability, each of the first core layer 22-1, the second core layer 22-2, the middle core layer 21, the third core layer 23-1, and the fourth core layer 23-2 of the left core 20-1 or the right core 20-2 may include a front block 20a having a U shape, and a rear block 20b having an inverse U shape.

Therefore, to operate the plasma reaction apparatus 100 according to some embodiments of the present invention, when an induced electromotive force is generated in the magnetic core 20 by the primary coil, an annular plasma discharge loop may be formed in the reactor body 10. Herein, a reaction gas may be supplied into the reactor body 10.

In this case, when reaction gases or exhaust gases of various chambers (not shown) are injected into the reactor body 10, the gases may be excited to a plasma state by receiving plasma energy or harmful components may be burned or purified due to reaction such as oxidation.

Herein, the chambers may include, for example, an ashing chamber for removing a photoresist, a chemical vapor deposition (CVD) chamber configured to deposit an insulating layer, and an etching chamber configured to etching apertures or openings in the insulating layer to form interconnection structures. Alternatively, the chambers may include a physical vapor deposition (PVD) chamber configured to deposit a barrier layer, and a PVD chamber configured to deposit a metal layer.

At this time, in the above-described plasma reaction apparatus 100 according to some embodiments of the present invention, edge cracks of the magnetic core 20 may be prevented by reducing a thermal deviation at edges by dividing upper and lower portions of the magnetic core 20 into a total of five layers, thereby increasing durability of mechanical parts and generating plasma more safely.

Meanwhile, as illustrated in FIG. 3, the plasma reaction apparatus 100 according to some embodiments of the present invention may further include a first cooling plate P1 mounted between the first core layer 22-1 and the second core layer 22-2, a second cooling plate P2 mounted between the second core layer 22-2 and the middle core layer 21, a third cooling plate P3 mounted between the middle core layer 21 and the third core layer 23-1, and a fourth cooling plate P4 mounted between the third core layer 23-1 and the fourth core layer 23-2.

Herein, the cooling plates P1, P2, P3, and P4 may be made of various thermally conductive materials such as copper, aluminum, steel, or stainless steel.

Therefore, the first core layer 22-1, the second core layer 22-2, the middle core layer 21, the third core layer 23-1, and the fourth core layer 23-2 may be electrically connected to each other by using the cooling plates P1, P2, P3, and P4.

As illustrated in FIG. 2, the plasma reaction apparatus 100 according to some embodiments of the present invention may further include first bent portions R1 bent downward from the first cooling plate P1 along side surfaces of the second core layer 22-2, and second bent portions R2 bent upward from the second cooling plate P2 along side surfaces of the second core layer 22-2, and having engaging portions E to engage with the first bent portions R1.

Therefore, the first core layer 22-1, the second core layer 22-2, the middle core layer 21, the third core layer 23-1, and the fourth core layer 23-2 may also be mechanically firmly connected to each other by using the engaging portions E.

As illustrated in FIG. 3, the plasma reaction apparatus 100 according to some embodiments of the present invention may further include a first thermal pad T1 mounted between the first core layer 22-1 and the first cooling plate P1, and a second thermal pad T2 mounted between the first cooling plate P1 and the second core layer 22-2.

Therefore, the first core layer 22-1, the second core layer 22-2, the middle core layer 21, the third core layer 23-1, and the fourth core layer 23-2 may also be thermally firmly connected to each other by using the thermal pads T1 and T2.

Figure 4:
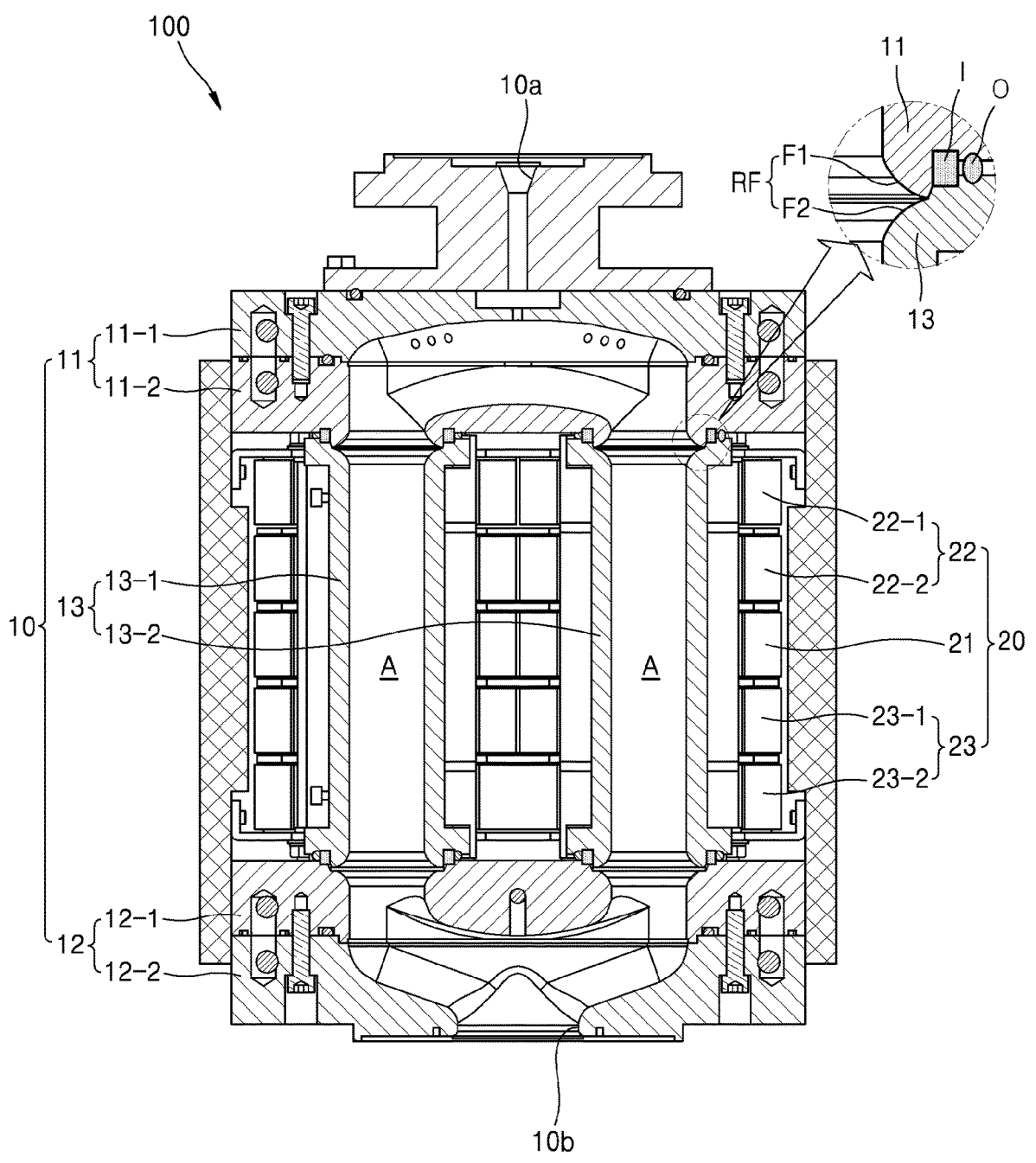
FIG. 4 is a cross-sectional view of the plasma reaction apparatus of FIG. 1.

FIG. 4 is a cross-sectional view of the plasma reaction apparatus 100 of FIG. 1.

As illustrated in FIG. 4, in the plasma reaction apparatus 100 according to some embodiments of the present invention, to increase an ignition area of facing surfaces between the upper block 11 and the I block 13 or between the I block 13 and the lower block 12 for block ignition, round surfaces RF, cross-sections of which have a curvature to increase an insulating section and inclined to face each other, may be provided at edges of the facing surfaces.

Herein, as illustrated in FIG. 4, an insulator I may be mounted between the upper block 11 and the I block 13 or between the I block 13 and the lower block 12 to maintain the insulating state, and the round surfaces RF may include an upper round surface F1 provided on the upper block 11 and a lower round surface F2 provided on the I block 13, so as to correspond to each other.

Therefore, using the above-described round surfaces RF, a plasma ignition region first started in the narrowest gap between the upper and lower round surfaces F1 and F2 provided on the narrowest surfaces may gradually expand to a wider gap and thus block ignition may be made better.

As such, edge cracks of the magnetic core 20 may be prevented by reducing a thermal deviation at edges by dividing upper and lower portions of the magnetic core 20, and, at the same time, block ignition may be made more stably by using the round surfaces RF.

Figure 5:
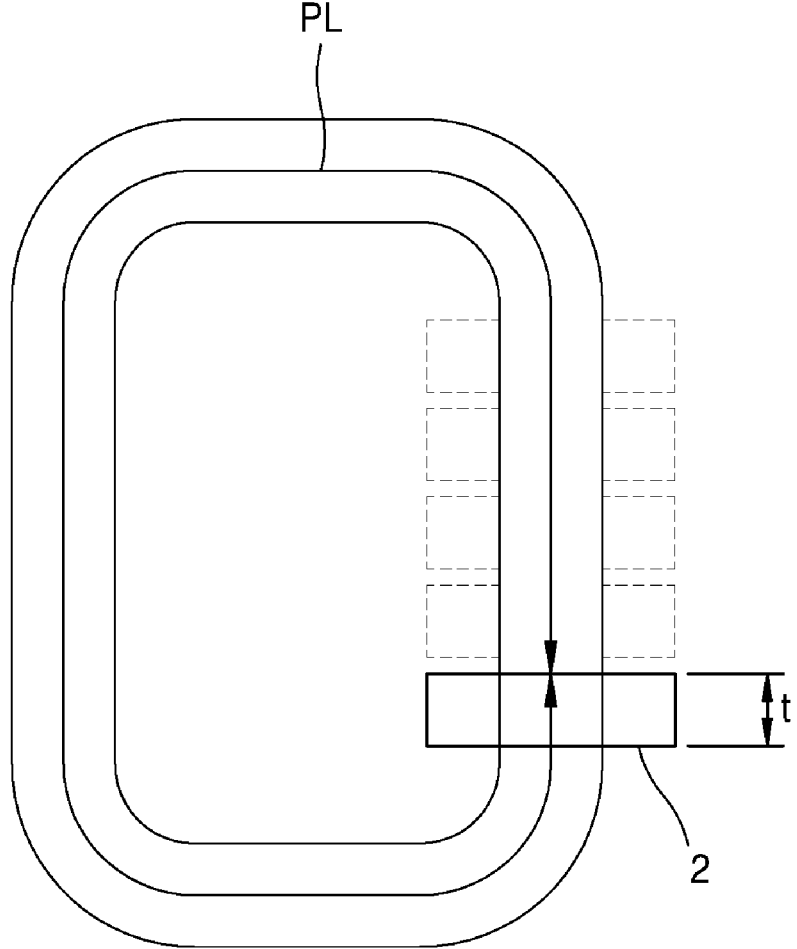
FIG. 5 is a conceptual view showing a unit core of a plasma reaction apparatus, according to other embodiments of the present invention.
Figure 6:
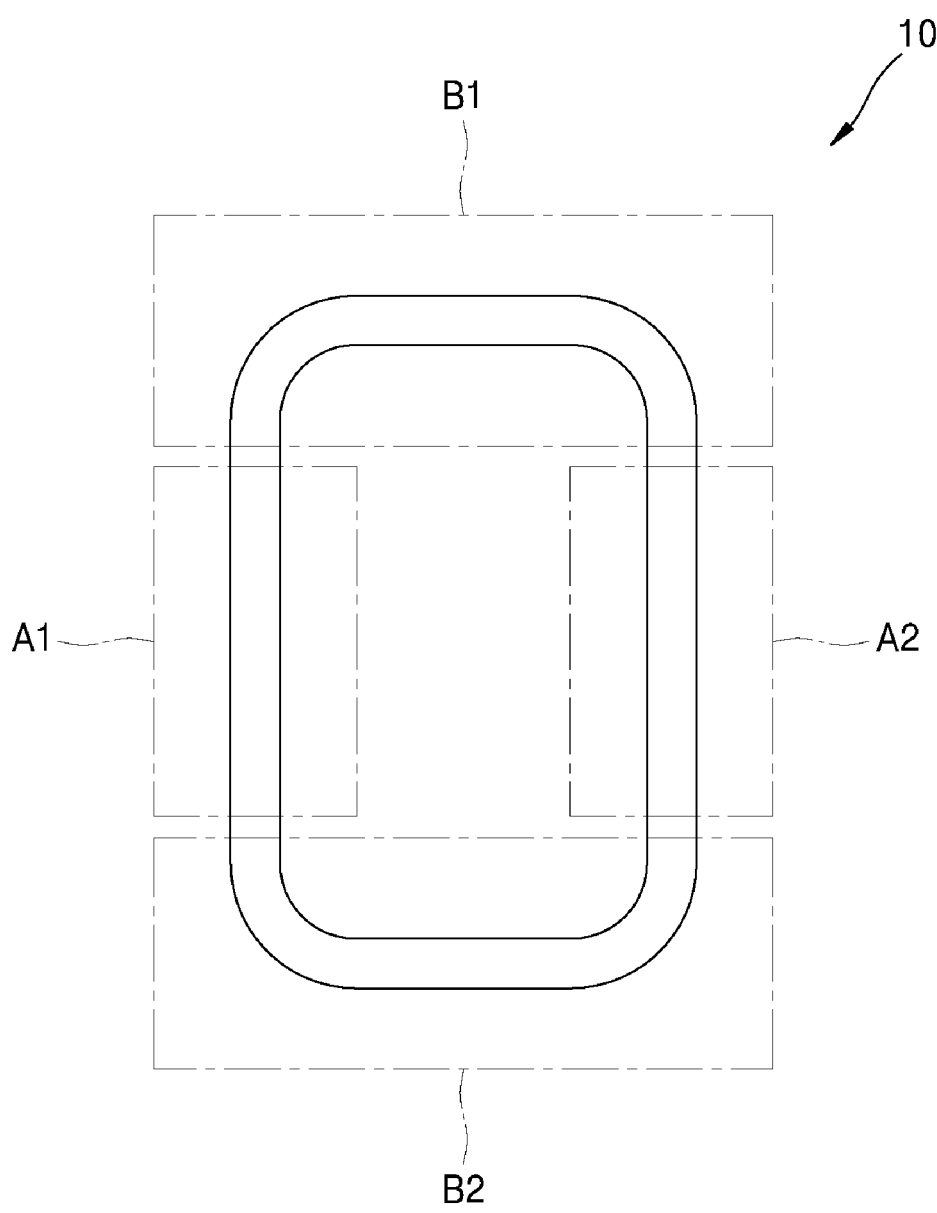
FIG. 6 is a conceptual view showing a first region and a second region of a plasma reaction apparatus, according to still other embodiments of the present invention.
Figure 7:
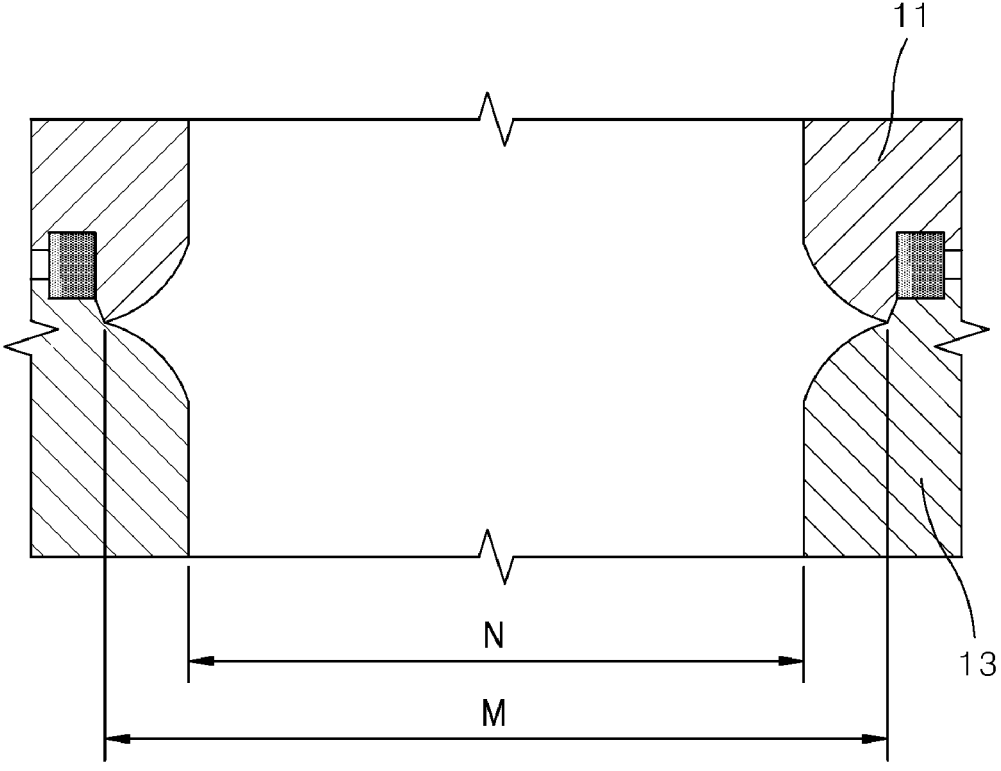
FIG. 7 is a cross-sectional view showing an inner diameter of an insulating section of a plasma reaction apparatus, according to still other embodiments of the present invention.

FIG. 5 is a conceptual view showing a unit core of a plasma reaction apparatus, according to other embodiments of the present invention, FIG. 6 is a conceptual view showing a first region and a second region of the plasma reaction apparatus, according to still other embodiments of the present invention, and FIG. 7 is a cross-sectional view showing an inner diameter of an insulating section of the plasma reaction apparatus, according to still other embodiments of the present invention.

A specific and numerically optical example of the plasma reaction apparatus according to other embodiments of the present invention will now be described with reference to FIGS. 5 to 7. As shown in FIG. 5, a range in which a unit core 2 constituting a magnetic core surrounds a reactor body, or a thickness t of the unit core may be 3.5% to 4.5% of a plasma discharge channel PL. Herein, the plasma discharge channel PL may correspond to an annular loop formed along a central line of a reactor body.

That is, when the entirety of the plasma discharge channel PL is 100%, the thickness t of the unit core 2 may correspond to 3.5% to 4.5% of the plasma discharge channel PL.

In addition, as shown in FIG. 6, the reactor body 10 may be divided into a first region A1+A2 where the magnetic core is mounted, and a second region B1+B2 where the magnetic core is not mounted. In this case, when the first region occupies 35% to 45%, the second region may occupy 55% to 65%.

Herein, the magnetic core may include unit cores symmetrically mounted one-to-one on left and right sides of a symmetrical structure. The first region A1+A2 corresponds to a region where the unit cores are stacked on one another. For example, a volume of a portion corresponding to the first region A1+A2 may be 40 ml to 42 ml.

Meanwhile, as shown in FIG. 7, considering optimal plasma ignition efficiency, an inner diameter M of an insulating section corresponding to a portion where an upper round surface and a lower round surface of the plasma reaction apparatus according to other embodiments of the present invention are in contact may be 1.25 times to 1.35 times an inner diameter N of an I block.

That is, for example, the inner diameter M of the insulating section may be in a range of 125% to 135% of the inner diameter of the I-shaped block.

While the present invention has been particularly shown and described with reference to embodiments thereof, it will be understood by one of ordinary skill in the art that various changes in form and details may be made therein without departing from the scope of the present invention as defined by the following claims.

INDUSTRIAL APPLICABILITY

In the above-described plasma reaction apparatus according to an embodiment of the present invention, edge cracks of a magnetic core may be prevented by reducing a thermal deviation at edges by dividing upper and lower portions of the magnetic core, and block ignition may be made more stably, thereby preventing breakage of the apparatus due to damage of the magnetic core and increasing plasma generation efficiency.

The invention claimed is:

1. A plasma reaction apparatus comprising:
   a reactor body having an annular loop space therein; and
   a magnetic core having a primary coil to generate plasma in the annular loop space,
   wherein a range in which a unit core constituting the magnetic core surrounds the reactor body is 3.5% to 4.5% of a plasma discharge channel,
   wherein the reactor body has a gas inlet at a side thereof and a plasma outlet at another side thereof, and has a symmetric structure in which a gas injected through the gas inlet is split into at least two channels,
   wherein the magnetic core comprises unit cores symmetrically mounted one-to-one on left and right sides of the symmetric structure,
   wherein the reactor body is divided into a first region where the magnetic core is mounted, and a second region where the magnetic core is not mounted, and
   wherein, when the first region occupies 35% to 45%, the second region occupies 55% to 65%.

2. The plasma reaction apparatus of claim 1, wherein a volume of a portion of the reactor body corresponding to the first region is 40 ml to 42 ml.

3. The plasma reaction apparatus of claim 2, wherein unit cores mounted in the first region are provided in five layers.

4. The plasma reaction apparatus of claim 3, wherein a cooling plate and a thermal pad are provided between adjacent unit cores.

5. The plasma reaction apparatus of claim 3, wherein the reactor body has a form of a toroidal bezel made of a conductive material, and comprises at least one insulating section.

6. The plasma reaction apparatus of claim 5, wherein, when a plurality of insulating sections are present, the reactor body is divided into an upper block, a lower block, and an I-shaped block.

7. The plasma reaction apparatus of claim 6, wherein the magnetic core is mounted on the I-shaped block.

8. The plasma reaction apparatus of claim 7, wherein an inner diameter of the insulating section is in a range of 125% to 135% of an inner diameter of the I-shaped block.

9. The plasma reaction apparatus of claim 8, wherein the insulating section comprises inclined surfaces having a curvature and facing each other.

10. A plasma reaction apparatus comprising:
    a reactor body having a gas inlet at a side thereof, a plasma outlet at another side thereof, and an annular loop space therein; and
    a magnetic core provided in a shape surrounding at least a part of the reactor body, and having a primary coil to generate plasma by exciting a gas in the annular loop space,
    wherein the magnetic core comprises:
    a middle core layer;
    an upper core layer mounted on the middle core layer; and
    a lower core layer mounted under the middle core layer,
    wherein the upper core layer is divided into a first core layer and a second core layer to prevent edge cracks of the upper core layer by reducing an upper thermal deviation, and
    wherein the lower core layer is divided into a third core layer and a fourth core layer to prevent edge cracks of the lower core layer by reducing a lower thermal deviation.

11. The plasma reaction apparatus of claim 10, wherein the first core layer, the second core layer, the middle core layer, the third core layer, and the fourth core layer have substantially the same shape, and are stacked on one another in a vertical direction.

12. The plasma reaction apparatus of claim 11, wherein the magnetic core comprises:

a left core provided in a rectangular ring shape surrounding a first I block which forms a side of the annular loop space; and a right core provided in a rectangular ring shape surrounding a second I block which forms another side of the annular loop space, and wherein each of the first core layer, the second core layer, the middle core layer, the third core layer, and the fourth core layer of the left core or the right core comprises a front block having a U shape, and a rear block having an inverse U shape.

13. The plasma reaction apparatus of claim 12, further comprising:

a first cooling plate mounted between the first core layer and the second core layer;

a second cooling plate mounted between the second core layer and the middle core layer;

a third cooling plate mounted between the middle core layer and the third core layer; and a fourth cooling plate mounted between the third core layer and the fourth core layer.

14. The plasma reaction apparatus of claim 13, further comprising:

first bent portions bent downward from the first cooling plate along side surfaces of the second core layer; and second bent portions bent upward from the second cooling plate along side surfaces of the second core layer, and having engaging portions to engage with the first bent portions.

15. The plasma reaction apparatus of claim 13, further comprising:

a first thermal pad mounted between the first core layer and the first cooling plate; and a second thermal pad mounted between the first cooling plate and the second core layer.

16. The plasma reaction apparatus of claim 10, wherein the reactor body comprises:

an upper block having the gas inlet;

a lower block having the plasma outlet; and an I block connecting the upper block with the lower block, and comprising a first I block and a second I block to form the annular loop space, and wherein, to increase an ignition area of facing surfaces between the upper block and the I block or between the I block and the lower block for block ignition, round surfaces, cross-sections of which have a curvature to increase an insulating section and inclined to face each other, are provided at edges of the facing surfaces.

17. The plasma reaction apparatus of claim 16, wherein an insulator is mounted between the upper block and the I block or between the I block and the lower block.

18. The plasma reaction apparatus of claim 17, wherein the round surfaces comprise an upper round surface provided on the upper block and a lower round surface provided on the I block, so as to correspond to each other, and wherein an inner diameter of a portion where the upper and lower round surfaces are in contact is 1.25 times to 1.35 times an inner diameter of the I block.

* * * * *